United States Patent
Yang et al.

(10) Patent No.: US 11,139,371 B2
(45) Date of Patent: Oct. 5, 2021

(54) TWO-DIMENSIONAL SEMICONDUCTOR WITH GEOMETRY STRUCTURE AND GENERATING METHOD THEREOF

(71) Applicant: National Tsing Hua University, Hsinchu (TW)

(72) Inventors: Tung-han Yang, Hsinchu (TW); Yeu-wei Harn, Hsinchu (TW); Xin-quan Zhang, Hsinchu (TW); I-tung Chen, Hsinchu (TW); Yi-hsien Lee, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 16/594,217

(22) Filed: Oct. 7, 2019

(65) Prior Publication Data
US 2020/0111868 A1    Apr. 9, 2020

(30) Foreign Application Priority Data
Oct. 8, 2018    (TW) ................ 107135333

(51) Int. Cl.
| | |
|---|---|
| H01L 21/02 | (2006.01) |
| H01L 29/06 | (2006.01) |
| H01L 29/16 | (2006.01) |
| H01L 29/24 | (2006.01) |
| H01J 19/24 | (2006.01) |
| H01L 29/22 | (2006.01) |
| H01L 29/20 | (2006.01) |

(52) U.S. Cl.
CPC .......... *H01L 29/0665* (2013.01); *H01J 19/24* (2013.01); *H01L 21/0262* (2013.01); *H01L 21/02568* (2013.01); *H01L 29/1606* (2013.01); *H01L 29/2003* (2013.01); *H01L 29/22* (2013.01); *H01L 29/24* (2013.01)

(58) Field of Classification Search
CPC .................................................... H01L 41/16
See application file for complete search history.

(56) References Cited

U.S. PATENT DOCUMENTS

| 9,637,839 B2 | 5/2017 | Kong et al. | |
| 2019/0189840 A1* | 6/2019 | Tsai | ............ H01S 5/1067 |

FOREIGN PATENT DOCUMENTS

| CN | 106477621 A | 3/2017 |
| WO | WO2017195118 A1 | 11/2017 |

* cited by examiner

*Primary Examiner* — William A Harriston
(74) *Attorney, Agent, or Firm* — Alan D. Kamrath; Karin L. Williams; Mayer & Williams PC

(57) ABSTRACT

A two-dimensional (2D) semiconductor with geometry structure and generating method thereof is disclosed herein and the method includes following steps: forming a nano-layer; disposing a 2D material on a substrate; forming a medium layer on the 2D material; transferring the medium layer and the 2D material to the nano-layer; removing the medium layer and leaving the 2D material on a surface of the nano-layer. In accordance with the generating method for 2D semiconductor with geometry structure, a nano microstructure is implemented to enhance and control the 2D materials for field emission and photon emission efficiency.

11 Claims, 8 Drawing Sheets

TWO-DIMENSIONAL SEMICONDUCTOR WITH GEOMETRY STRUCTURE AND GENERATING METHOD THEREOF

BACKGROUND OF THE INVENTION

1. Technical Field

The present invention relates to a two-dimensional semiconductor with geometry structure and generating method thereof, and more particularly to a two-dimensional semiconductor with geometry structure and generating method thereof to enhance electron field emitting effect and photon emission properties that can be used in quantum communication and quantum information.

2. Description of Related Art

When electrons are under high electron field acceleration, it is called an electron field emission effect when the electrons are emitted from the surface of an object, This effect can be applied to a photoelectric element. On the other hand, although two-dimensional (2D) semiconductors have very high photoelectric conversion efficiencies that can be applied to photovoltaic elements in the next generation, 2D semiconductors have very low efficiency for the electron field emission effect. Those phenomena are only observed at the edges of the materials. Therefore, the field emission effect cannot be applied practically. And the photon emission properties are also difficult to control because of different defect site of the 2D material can cause uniformity upon material, thereof, in this embodiment we design 1D nano-array structure to control the photon emission properties.

In the present prior art, there is no way to control the occurring position of the field emission effect of the 2D semiconductor material. Only the random observation of the two-dimensional semiconductor material at edges or a specific position can see the field emission effect. The characteristics and stability of the 2D semiconductor material have no commercial value In the Patent Cooperation Treaty application patent (WO 2017/195118), a structure is disclosed that includes a compound semiconductor in contact with a transition metal dichalcogenide layer. The metal dichalcogenide layer is contacted with a metal substrate. The semiconductor compound includes a nanowire, and the compound semiconductor includes SiC or ZnO. The transition metal dichalcogenide includes $MoS_2$, $MoSe_2$ and the like. This patent is used to improve the quantum efficiency of the compound semiconductor and its manufacturing method does not improve the efficiency of electron field emission effects.

The Chinese patent application (CN106477621A) discloses a method for preparing a layered zinc hydroxide nano-tube and is characterized by including the following steps: Step 1: mixing a metal zinc salt, an alkali source and an anionic surfactant in a system with pure water as the reaction solvent; Step 2: heating the mixing liquid in step 1 with a water bath to obtain the reaction. This patent discloses layered zinc hydroxide nanoplates, nanobelts, nanopyramids, zinc oxide nano-rods, nanoparticle, etc. that can be synthesized with different morphology. The layered zinc hydroxide is generated by an alkali source (hexamethylenetetramine) in combination with sodium lauryl sulfate. However, this patent is a method for preparing and exfoliating the layered zinc hydroxide and the zinc oxide nano-tapers. The patent is not intended to improve the efficiency of electron field emission effects.

In US patent application (US2014/0245946A1), a method for producing a transition metal dichalcogenide layer on a transfer substrate is disclosed. The method includes steps of: inoculating an aromatic molecule on a surface of a substratum; growing a metal dichalcogenide on the surface of the substratum and inoculating with an aromatic molecule; and contacting the inoculated aromatic molecule with a solvent that releases the transition metal dichalcogenide from the substratum. However, the patent discloses the synthesis and transfer of transition metal disulfide layers on different surfaces and is not to improve the efficiency of electron field emission effects.

It is obvious to see, in the prior art, there are no documents or patents trying to improve the efficiency of the electron field emission effect so as to propose an effective process method. Moreover, most studies indicate that the observed field emission performance is mainly attributed to the presence of random and sharply protruding "edges" of the layered 2D materials. It is difficult to ideally and uniformly control the edges of the 2D materials that are perpendicular to the substrate, which can increase the difficulty of generating large-area electron emitters with acceptable reproducibility.

Therefore, a need is arisen to design a 2D semiconductor with a geometric structure and a generating method thereof and a nanostructure is used to enhance and control the 2D material in the results of the field emission effect and to improve the absences of the conventional technology.

BRIEF SUMMARY OF THE INVENTION

An object of the present invention is to provide a 2D semiconductor with a geometric structure and a generating method thereof, and the method is used to increase the efficiency of the electron field emission effect.

According to the object, the present invention provides a generating method for a 2D semiconductor with a geometry structure, comprising steps of:
 forming a nano-layer;
 disposing a 2D material on a substrate;
 forming a medium layer on the 2D material;
 transferring the medium layer and the 2D material to the nano-layer; and
 removing the medium layer and leaving the 2D material on a surface of the nano-layer.

Another object of the present invention is to provide a 2D semiconductor with a geometry structure, a nano structure is used to enhance and control a result of the field emission effect of a 2D material by implementing the 2D semiconductor.

According the object above, the present invention provides a 2D semiconductor with a geometry structure, comprising:
 a 2D material; and
 a nano-layer having a geometry structure, and the 2D material disposed on the nano-layer having the geometry structure;
 wherein an interval within the nano-layer having the geometry structure is 50-100 nm.

Through the 2D semiconductor with the geometric structure and the generating method thereof in the present invention, a 2D transition metal dichalcogenide monolayer is transferred to a vertically arranged 1D zinc oxide nanometer array to induce geometrical modulation of the semiconductor monolayer so as to further enhance its electron emission. A single semiconductor layer with a sharp one-dimensional nano-array is used to achieve effective field emission with excellent long-term emission stability in a low conduction field.

DETAILED DESCRIPTION OF THE INVENTION

These and other aspects of the embodiments herein will be better appreciated and understood when considered in conjunction with the following description and the accompanying drawings.

Figure 1:
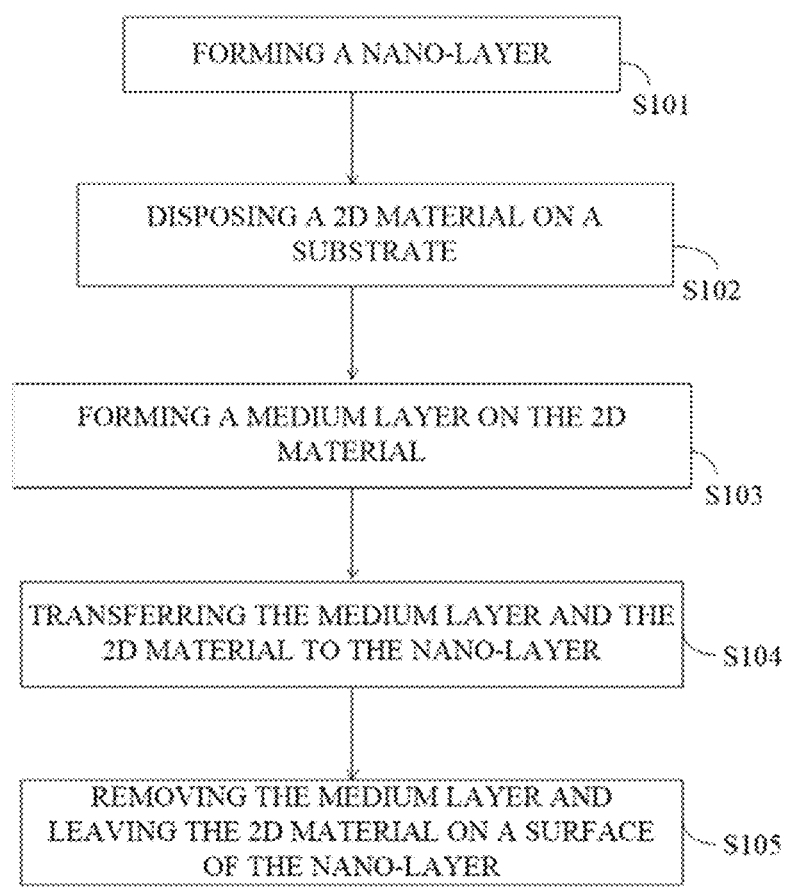
FIG. 1 is a flow chart of a generating method a 2D semiconductor with a geometric structure in the present invention.
Figure 2:
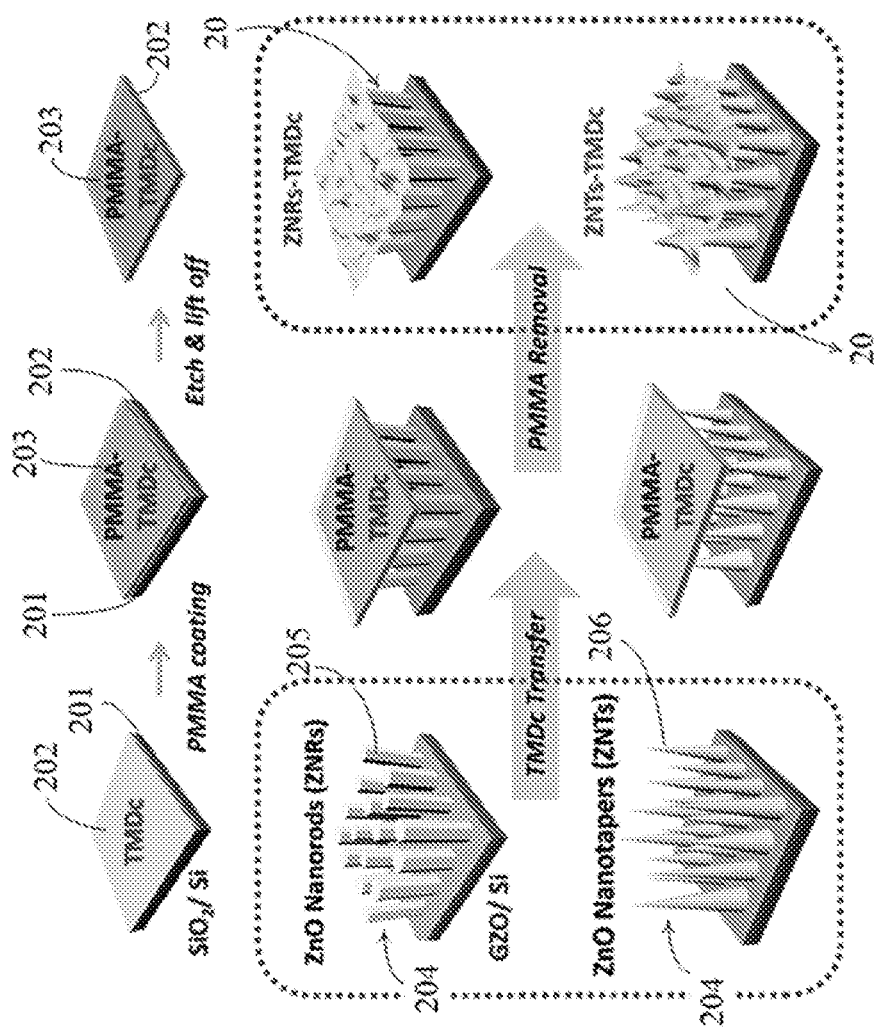
FIG. 2 is a schematic diagram of the formation of the 2D semiconductor with the geometric structure in the present invention.

FIG. 1 shows a flow chart of a generating method of a two-dimensional (2D) semiconductor with a geometric structure in the present invention, and FIG. 2 shows a schematic diagram of the formation of a two-dimensional semiconductor with a geometric structure in the present invention. As shown in FIG. 1 and FIG. 2, the generating method of a 2D semiconductor 20 having a geometric structure in the present invention includes the following steps. In step S101, a nano-layer is formed. The nano-layer is preferred to be the nano-layer with geometric structure. In a preferred embodiment of the present invention, zinc nitrite hexahydrate $(Zn(NO_2)_2 \cdot 6H_2O)$ and hexamethylenetetramine $(C_6H_{12}N_4)$ are dissolved in a deionized water solution, and the substrate for the nano-array is heated in this solution to form a nano-layer 204, and the substrate is preferably a gallium-doped zinc oxide (GZO)/silicon (Si) substrate.

In step S102, a 2D material is generated on a substrate. In one embodiment of the present invention, the 2D material 202 is preferably formed on a silicon substrate 201 by chemical vapor deposition (CVD). In the present invention, the 2D material is preferred to be a 2D transition metal dichalcogenide (TMD), and the transition metal dichalcogenide is preferably molybdenum disulfide ($MoS_2$) or molybdenum selenide ($MoSe_2$), but it is not limited herein. Moreover, on the silicon substrate 201, an atomic layer (including $MoS_2$ and $MoSe_2$) with a large-area and highly crystalline of the 2D material 202 is synthesized by ambient pressure chemical vapor deposition (CVD).

In step S103, a medium layer is formed on the 2D material. In one embodiment of the present invention, the medium layer include polymer materials and the medium layer (polymer layer) is formed on the 2D material of the silicon substrate by a spin coating method, a water transfer method or a pyrolysis method. For example, polymethyl methacrylate (PMMA) or Polydimethylsiloxane (PDMS) is spin coated at a speed of 1000 rpm on a sample of the 2D transition metal dichalcogenide ($MoS_2$ or $MoSe_2$).

In step S104, the medium layer and the 2D material are transferred to the nano-layer. The transferring method includes an etching method, but it is not limited in the present invention. The medium layer (polymer layer) 203 and the 2D material 202 are transferred to the nano-layer 204 by etching, and the contact point between the 2D material 202 and the nano-layer 204 is deformed because of the different stress.

Furthermore, a polymethyl methacrylate method is assistedly used to transfer the 2D transition metal dithiol 202 from the silicon ($SiO_2/Si$) substrate 201 to a 1D zinc oxide nano-array substrate (ZnO nano-rods (ZNRs) array 205 or ZnO nanotubes (ZNTs) array 206). After baking, the 2D material 202 coating with the polymethyl methacrylate is completely immersed in a potassium hydroxide (KOH) solution (1M) to etch the substrate ($SiO_2/Si$) (peeling process) until the polymethyl methacrylate with the 2D material 202 ($MoS_2$ or $MoSe_2$) floating in the potassium hydroxide solution. After the potassium hydroxide residue was removed by derinsing with deionized water, the 2D material 202 coating with the polymethyl methacrylate was captured.

At final, in step S105, the medium layer is removed to leave the 2D material on the surface of the nano-layer. In one embodiment of the present invention, the medium layer (the polymer layer) 203 is removed to leave the 2D material 202 on the surface of the nano-layer 204 by dissolving the polymethyl methacrylate using acetone to leave the sample of the 2D material 202 on a surface of the nano-layer 204.

Still referring to FIG. 2, the 2D semiconductor 20 with the geometric structure includes a 2D material 202 and a nano-layer 204. The 2D material 202 is placed on the 2D semiconductor 20 with a geometric structure, and the 2D material 202 is disposed on the nanometer layer 204. The contact point between the 2D material 202 and the nano-layer 204 having a geometry structure is deformed due to different stress. The nano-layer 204 having the geometry structure is arranged in an array, and the nano-layer 204 having the geometry structure includes has an interval 50-100 nm and preferred to be 50 nm. The nano-array has a density of $2 \times 10^9/cm^2$. The nano-layer 204 in the present invention may be a 1D nano-rod array or a 1D nano-cube array as shown in FIG. 2 and it is not limited herein. The 1D nano-array may be a 1D zinc oxide nano-array, or the material of the nano-layer 204 may be silicon, noble metal, hafnium oxide, aluminum oxide, silicon oxide or titanium oxide. When the material of the nano-layer 204 is the noble metal, the noble metal can be gold, silver, platinum, palladium and so on). The height of the conical protrusion of the 1D nano-taper is 347±25 nm. After disposing the 2D material 202, the distance between the highest point and the lowest point of the 2D material 202 is 80±30 nm.

Figure 3A:
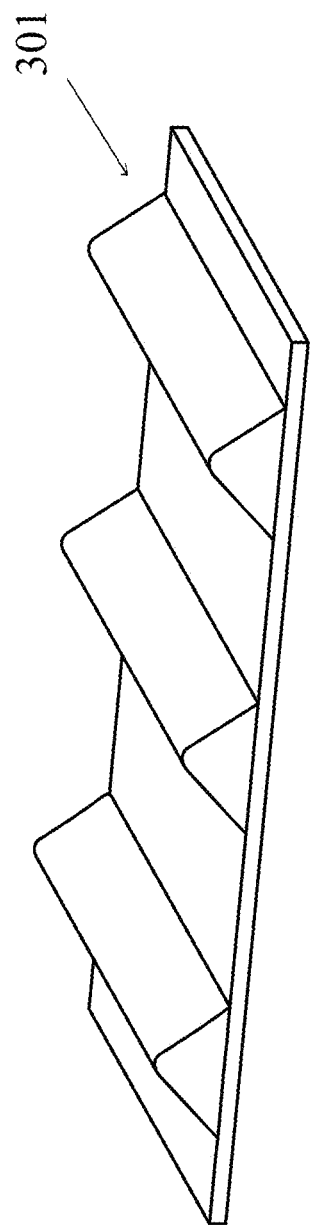
FIG. 3A and FIG. 3B are schematic views of the parallel nanostructures of the present invention.
Figure 3B:
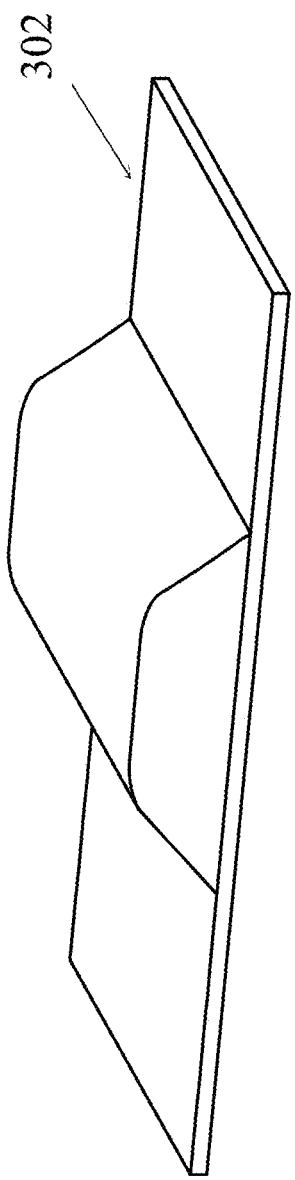

The 2D material 202 may be composed of 2D transition metal dichalcogenide, graphene, or boron nitride. The shape of the nano-layer 204 having the geometry structure may be a conical shape, a triangular pyramid shape, a quadrangular pyramid shape, a pentagonal pyramid shape, a hexagonal pyramid shape, a polygonal pyramid shape, or a bullet type. When the nano-layer 204 has a pyramid shape, the angle of the tip cone is less than 2°. In addition, in a different embodiment, the nano-layer 301 may include a plurality of parallel nanostructures, as shown in FIG. 3A. When the nano-layer 302 is conical, the top of the nano-layer 302 is a cylinder with a curvature, and the half-circle curvature is preferably less than 10 nm. The surface area of the nano-layer 302 is preferably less than 100 nm, as shown in FIG. 3B. In an embodiment of the present invention, a material layer may be further disposed on the nano-layer 204, and the material layer is preferably a layer with noble metal material. The noble metal material can be gold, silver, platinum, palladium and so on. The material layer plated on the nano-layer 204 can induce to the characteristic of surface plasma resonance. The free electrons in the metal of the material layer have the opportunity to interact with the electrons in the 2D material 202. The electro-optical characteristics of the 2D material 202 can be increased.

Furthermore, in the process of synthesizing the 2D semiconductor with geometric materials, the synthesis of the 2D transition metal dichalcogenide, the 1D nanostructures and their hybrids (2D-1D heterostructures) is scalable with high uniformity in a large area of 2×2 $cm^2$. The geometry of the 2D transition metal dichalcogenide was modulated with the nanostructures, including ZnO nano-rods (ZNRs) and ZnO nano-cubes (ZNTs).

Figure 4A:
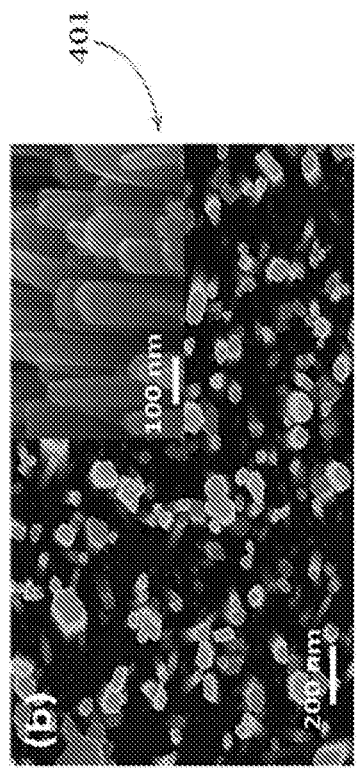
FIG. 4A is an electron microscope image of a 1D zinc oxide nano-array substrate (nanometer rod) according to the present invention; FIG.

The ZNRs were synthesized on the sputtered GZO (Ga (0.01) and Zn (0.99)) seeding layer by the hydrothermal reaction. The GZO film shows excellent conduction and provides an appropriate surface for the growth of the ZNRs with good vertical alignment. The blunt ZNRs 401 crystallized along c-axis with six prismatic planes are shown in the scanning electron microscope (SEM) image in FIG. 4A.

Figure 4B:
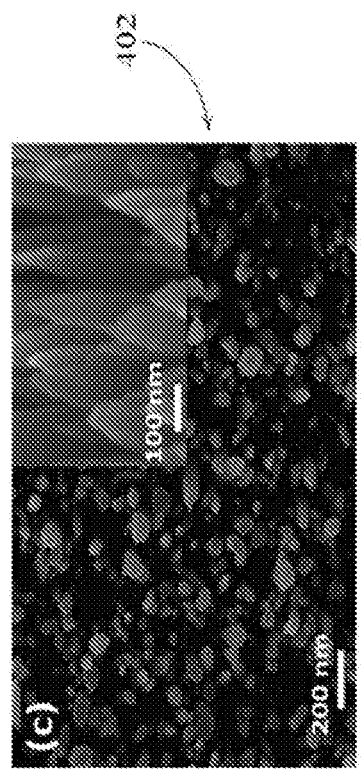
FIG. 4B is an electron microscope image of a 1D zinc oxide nano-array substrate (nano-tube) of the present invention.

In addition, the vertex curvature of nano-rods, such as blunt tips and conical tips, can be precisely fabricated by controlling the etching process. In FIG. 4B, the electron microscope image of the nano-tubes 402 show a fully aligned conical tip after the etching process, and the length of the nano-tubes 402 (347±25 nm) are only slightly shorter than the length of the nano-rods 401.

Figure 5A:
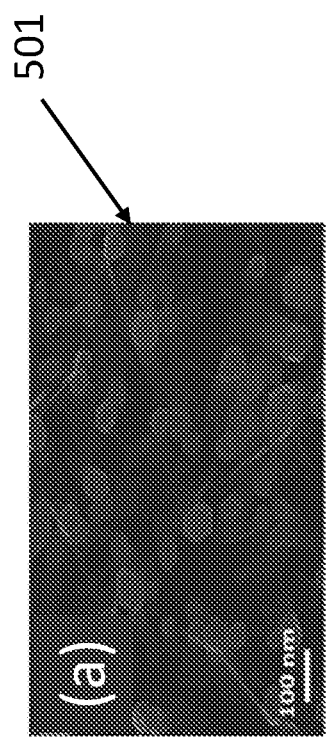
FIGS. 5A, 5B and 5C are electron microscope images of a 2D transition metal dichalcogenide monolayer of the present invention on a nano-rod.
Figure 5B:
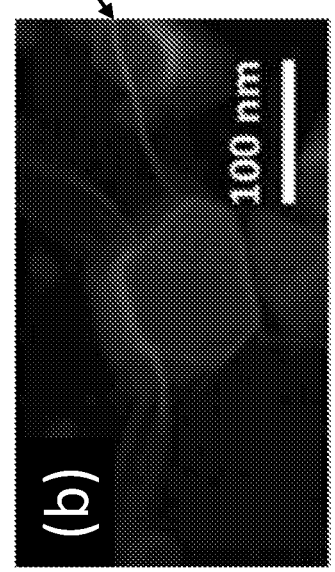
Figure 5C:
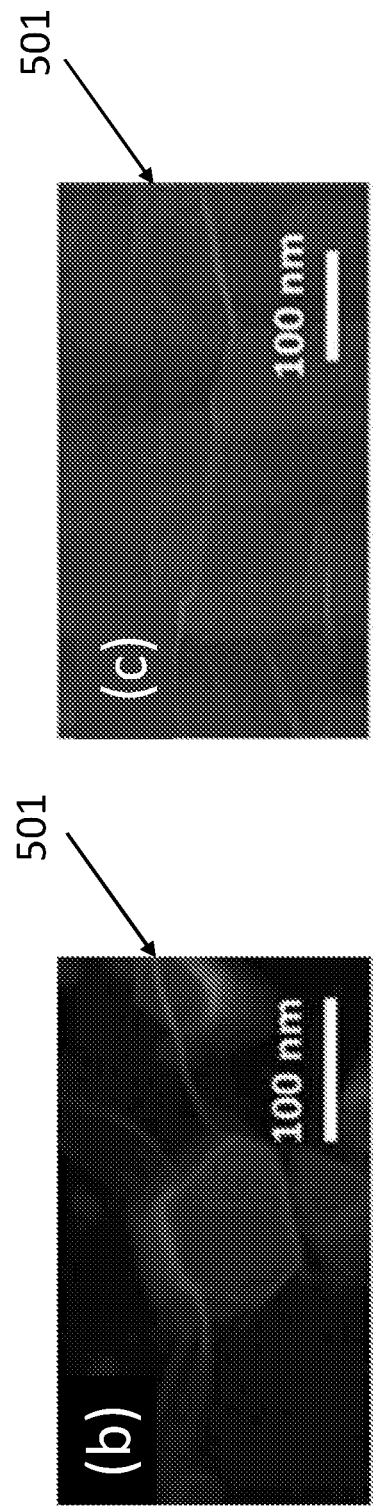
Figure 6A:
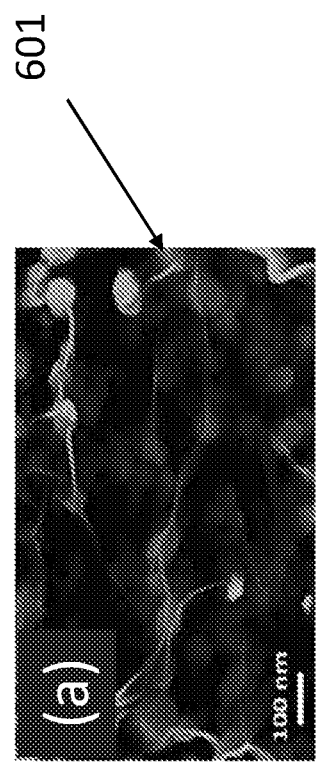
FIGS. 6A, 6B and 6C are electron microscopy images of a 2D transition metal dichalcogenide single layer covered by the present invention in a nano-tube.
Figure 6C:
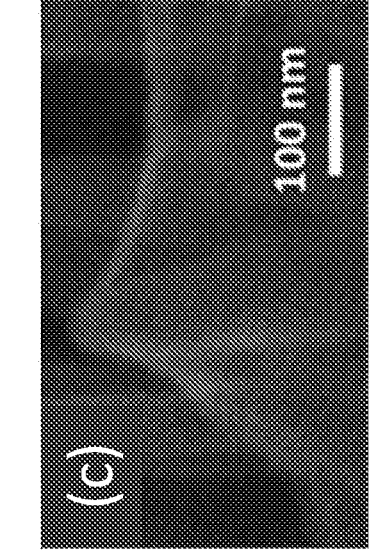
Figure 6B:
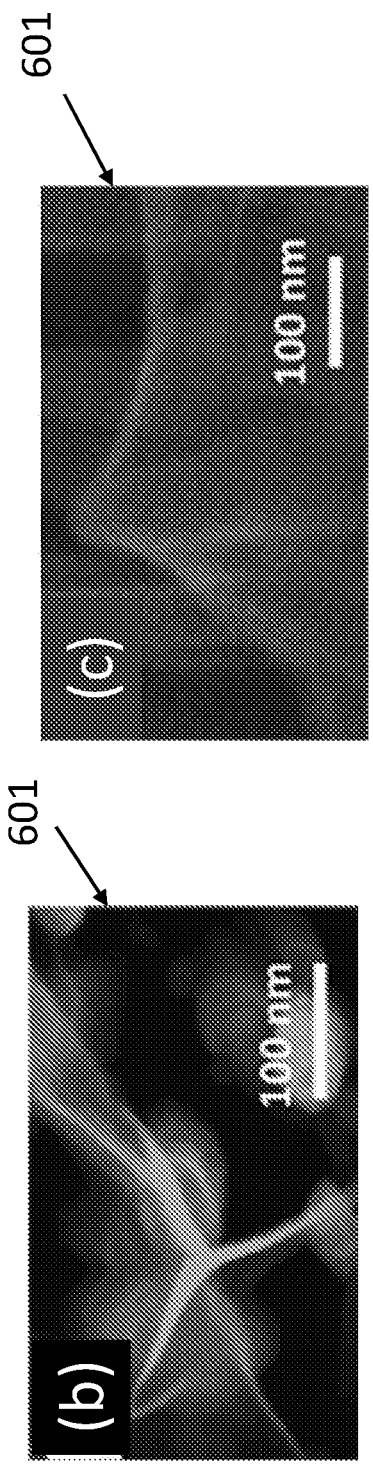

The 2D transition metal dichalcogenide ($MoS_2$) monolayer can be uniformly supported on the rods of the nano-rods 501 (FIGS. 5A, 5B and 5C) and results in a moiré morphology. By comparing, the 2D transition metal dichalcogenide ($MoS_2$) monolayer is tightly covered on the rod of the nano-rods 601 (FIGS. 6A, 6B and 6C) and results in a tent-like morphology. This indicates that the morphology of the 2D transition metal dichalcogenide monolayer can be clearly adjusted by geometrically controlling the vertically aligned one-dimensional array. For 1D nano-rods, the 2D transition metal dichalcogenide monolayer shows more spatially-aligned ripples along the sharp 1D array, which can be considered as the sharp protrusion form of the 2D transition metal dichalcogenide monolayer. Similar 2D-1D heterostructures can be obtained with the 2D transition metal dichalcogenide monolayer and exhibit a similar surface morphology. During removing the polymethyl methacrylate from the monolayer by the acetone solution, the tensile stress will correlate with the apex geometry of the supported 1D array and further produce spatially aligned defects with the 2D monolayer and the 1D array.

Figure 7:
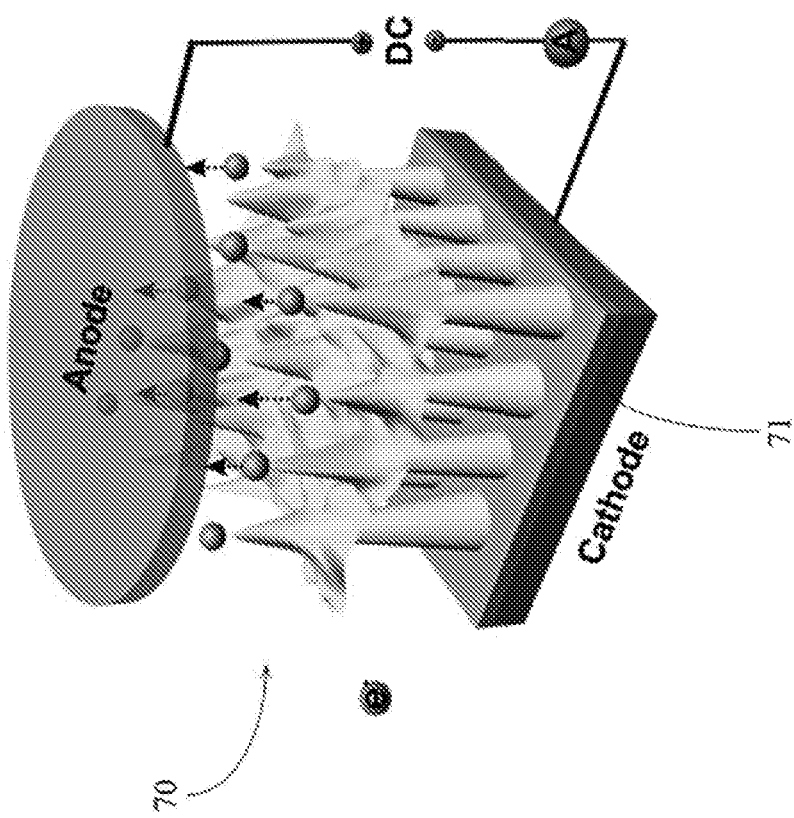
FIG. 7 is a schematic diagram of measuring a 2D semiconductor measurement field emission with a geometric structure of the present invention.
Figure 8:
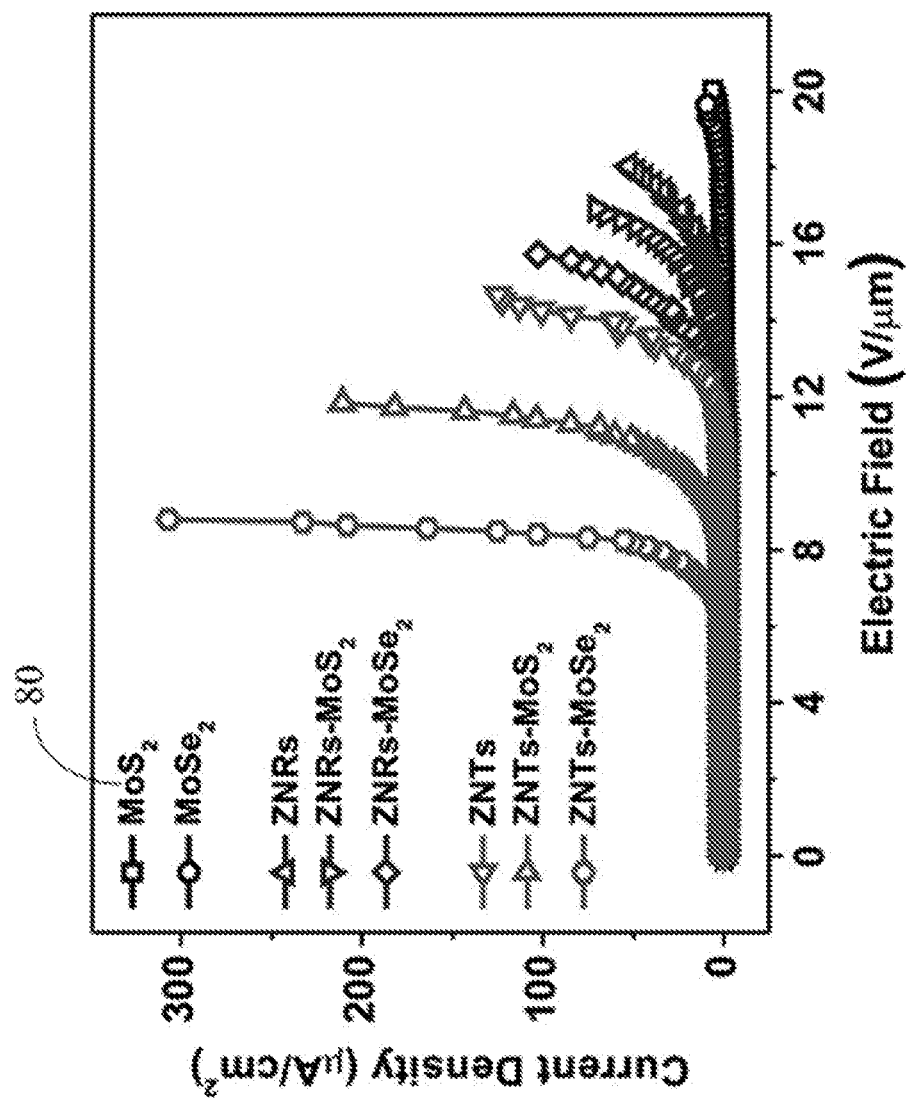
FIG. 8 is a field emission J-E characteristic diagram of a two-dimensional semiconductor with a geometric structure to which the present invention is applied.

FIG. 7 is a schematic diagram of measuring a measurement field emission of the 2D semiconductor with a geometric structure in the present invention, and FIG. 8 is a field emission J-E characteristic diagram of the 2D semiconductor with a geometric structure applied in the present invention. In order to study the performance of the 2D semiconductor with a geometric structure, an electron field emission experiment was performed under a base pressure of 5×10-7 torr in a high vacuum system, as shown in FIG. 8. The 2D semiconductor 70 was mounted on a stainless steel bracket 71 as a cathode, and the anode was a molybdenum probe (diameter 1 mm). The current-voltage relationship is achieved by applying a DC voltage across the 2D semiconductor and the anode. FIG. 8 shows the field emission current density-field strength characteristics of various different 2D semiconductors with geometric structures. As expected, the detectable electron field emission of the 2D semiconductor 80 (with $MoS_2$ or $MoSe_2$) exceeds the detectable limit until the electron field of maximum ≈20 V μm−1 is applied.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A 2D semiconductor with geometry structure, comprising:
    forming a nano-layer;
    a 2D material; and
    a nano-layer having a geometry structure, and the 2D material disposed on the nano-layer having the geometry structure;
    wherein an interval within the nano-layer having the geometry structure is 50-100 nm;
    wherein the nano-layer having the geometry structure includes mutually parallel nanostructures, and
    wherein an interval between the nanostructures is 50 nm.

2. The 2D semiconductor with geometry structure of claim 1, wherein the 2D material is a 2D transition metal dichalcogenide, a graphene or a boron nitride.

3. The 2D semiconductor with geometry structure of claim 1, wherein the nano-layer having the geometry structure is a 1D zinc oxide nano-array substrate.

4. The 2D semiconductor with geometry structure of claim 1, wherein the nano-layer having the geometry structure is arranged in an array.

5. The 2D semiconductor with geometry structure of claim 1, wherein a material of the nano-layer is silicon, noble metal, hafnium oxide, aluminum oxide, silicon oxide or titanium oxide.

6. The 2D semiconductor with geometry structure of claim 1, wherein the nano-layer is conical triangular, quadrangular, pentagonal, hexagonal, polygonal or bullet type.

7. The 2D semiconductor with geometry structure of claim 1, wherein a surface area of the nano-layer having the geometry structure is less than 100 nm.

8. The 2D semiconductor with geometry structure of claim 1, wherein a material layer is further coated on the nano-layer having the geometry structure.

9. The 2D semiconductor with geometry structure of claim 8, wherein the material layer is a noble metal material layer.

10. The 2D semiconductor with geometry structure of claim 9, wherein the noble metal material layer is the material layer with gold, silver, platinum or palladium.

11. A 2D semiconductor with geometry structure comprising:

forming a nano-layer;
a 2D material; and
a nano-layer having a geometry structure, and the 2D material disposed on the nano-layer having the geometry structure;
wherein an interval within the nano-layer having the geometry structure is 50-100 nm,
wherein the nano-layer having the geometry structure is arranged in an array, and
wherein a density of the array is $2\times10^9/cm^2$.

* * * * *